(12) United States Patent
Watkins

(10) Patent No.: US 6,611,214 B1
(45) Date of Patent: Aug. 26, 2003

(54) ROM CODE COMPRESSION

(75) Inventor: Daniel Watkins, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/077,351

(22) Filed: Feb. 15, 2002

(51) Int. Cl.[7] .............................................. H03M 7/34
(52) U.S. Cl. ........................ 341/51; 341/55; 341/106; 341/87
(58) Field of Search ............................. 341/51, 77, 50, 341/87, 141, 95, 55, 106

(56) References Cited

U.S. PATENT DOCUMENTS

| | | | |
|---|---|---|---|
| 4,597,057 A | 6/1986 | Snow | 364/900 |
| 5,049,881 A | 9/1991 | Gibson et al. | 341/95 |
| 5,155,484 A * | 10/1992 | Chambers, IV | 341/55 |
| 5,229,768 A * | 7/1993 | Thomas | 341/51 |
| 5,455,577 A * | 10/1995 | Slivka et al. | 341/51 |
| 5,798,721 A | 8/1998 | Shibata | 341/106 |
| 5,936,616 A * | 8/1999 | Torborg et al. | 345/555 |
| 6,225,922 B1 | 5/2001 | Norton | 341/87 |

* cited by examiner

Primary Examiner—Brian Young
Assistant Examiner—John B Nguyen
(74) Attorney, Agent, or Firm—Christopher P. Maiorana, P.C.

(57) ABSTRACT

An apparatus comprising a one or more memory circuits and an uncompress circuit. The one or more memory circuits may be configured to (a) store (i) a number of compressed code words and (ii) a number of delta words and (b) provide random access to the compressed code words in response to an address. The compressed code words may be losslessly compressed in response to (i) a number of uncompressed code words and (ii) the delta words. The delta words generally comprise bit strings that may be configured to minimize a size of the one or more memory circuits when deleted from the uncompressed code words. The uncompress circuit may be configured to losslessly uncompress the compressed code words in response to the delta words.

22 Claims, 6 Drawing Sheets

| DELTA_WORD_1 | 12b | 5 max | $1^{20b}, 3^{12b}$ | $2^{20b}, 2^{12b}$ | $1^{20b}, 3^{12b}$ | $1^{28b}, 3^{12b}$ | $1^{36b}, 2^{12b}$ | $1^{44b}, 1^{12b}$ |
|---|---|---|---|---|---|---|---|---|
| ⋮ | 20b | 3 max | $1^{20b}, 1^{28b}$ | | | | | |
| | 28b | 2 max | | | | | | |
| | 36b | 1 max | $1^{36b}, 3^{28b}$ | | | | | |
| DELTA_WORD_5 | 44b | 1 max | $1^{44b}, 3^{20b}$ | | | | | |

ROM CODE COMPRESSION

FIELD OF THE INVENTION

The present invention relates to a method and/or architecture for implementing read only memory (ROM) code generally and, more particularly, to a method and/or architecture for implementing ROM code compression and uncompression.

BACKGROUND OF THE INVENTION

Conventional methods and/or architectures for storing code in read only memories (ROMs) and flash memories typically store the code in uncompressed form. As a result, conventional ROMs and flash memories that are implemented to store code have one or more of the following deficiencies: (i) excessive die size, (ii) excessive cost, (iii) code storage is not optimized, (iv) a limited amount of code can be stored, and/or (v) circuitry and/or products that implement the code have limited features.

It would be desirable to have a method and/or architecture for implementing ROM (and flash memory) code storage compression and/or uncompression that (i) reduces the size and/or cost of ROM configured for storing the ROM code and (ii) maintains random, single cycle ROM access.

SUMMARY OF THE INVENTION

The present invention concerns an apparatus comprising one or more memory circuits and an uncompress circuit. The one or more memory circuits may be configured to (a) store (i) a number of compressed code words and (ii) a number of delta words and (b) provide random access to the compressed code words in response to an address. The compressed code words may be losslessly compressed in response to (i) a number of uncompressed code words and (ii) the delta words. The delta words generally comprise bit strings that may be configured to minimize a size of the one or more memory circuits when deleted from the uncompressed code words. The uncompress circuit may be configured to losslessly uncompress the compressed code words in response to the delta words.

The objects, features and advantages of the present invention include providing a method and/or architecture for implementing a read only memory (ROM) code compression and/or uncompression (or decompression) that may (i) provide scalable ROM code (ii) adapt to a target ROM size and/or a compression level target, (iii) optimize code compression, (iv) be implemented in software, firmware, hardware and/or any appropriate combination thereof, (v) be based on predetermined user constraints (e.g., memory size, compressed word format options, compressed word memory entry stuffing options, hardware performance architecture options, etc.), (vi) optimize the number of compression word entries, (vii) implement a lookup table (LUT) ROM for any location mapping to any ROM word, (viii) implement a word format that may provide for multiple compressed code entries to be implemented in a given word location, (ix) be broadly applicable (e.g., may be implemented via on-chip ROM, off-chip ROM, a combination of on-chip and off-chip ROM, and/or multiple stages of ROM), (x) be implemented in application specific integrated circuits (ASICs), customer specific integrated circuits (CSICs), field programmable gate arrays (FPGAs), standard parts, and/or embedded in ROM and/or flash memory devices, (xi) provide a small boot loader to download the compressed ROM code, (xii) provide a compressed boot loader in addition to compressed ROM code, (xiii) provide a programmed delta word base and a multiplexer control and a decoder circuit, (xiv) be scalable to different ROM word size and depth as well as any appropriate number of delta words, (xv) provide random access to the ROM code in the compressed format, (xvi) provide minimal and fast hardware to uncompress the ROM code words via known delta words (base) that are available in memory and multiple parallel absolute functions, and/or (xvii) maintain single cycle access to the ROM.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
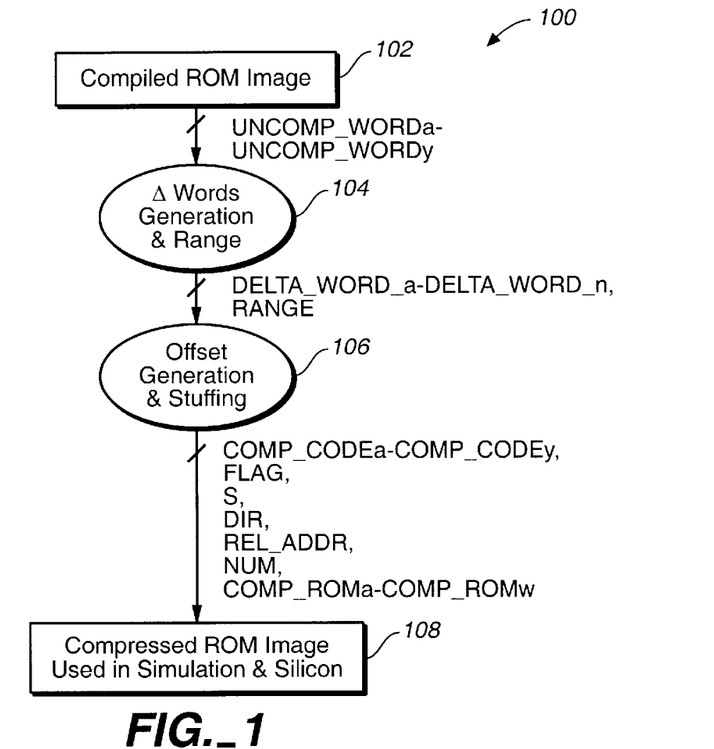
FIG. 1 is a flow chart illustrating a preferred embodiment of the present invention.

Referring to FIG. 1, a flow chart 100 of a compression operation (or method, process, routine, etc.) is shown in accordance with a preferred embodiment of the present invention. The process 100 may be a code (or data) compression operation. The operation 100 may be implemented as a read only memory (ROM) code compression operation. In one example, the operation 100 may be implemented in software. However, the operation (or process) 100 may be implemented in software, firmware, hardware, and/or any appropriate combination thereof accordingly to meet the design criteria of a particular application.

For a particular application, the size of the ROM code (e.g., in terms of word bit-width, bit-depth, number of words, etc.) is generally known prior to committing to a specific ROM gate level size. The operation 100 may provide an architecture and/or method that may compress the ROM code to reduce ROM gate level size that is implemented. The physical die size of a chip that implements the compressed ROM code may be reduced. The process 100 may yield cost reductions directly proportional to the reduction in physical die size. The process 100 may yield substantial cost reduction.in chips with many large ROMs.

In one example, the ROM code compression operation 100 may reduce an uncompressed 2432×64 ROM size to a compressed 512×64 ROM plus a 2432×11 ROM. The ROM code size reduction may yield a die size reduction of uncompressed ROM of 0.35 mm to compressed ROM of 0.14 mm+0.11 mm=0.25 mm for a net reduction of 0.10 mm on the corresponding silicon die. In another example, the ROM code compression process 100 may reduce an uncompressed 4K×24 ROM size code ROM to a compressed 1.3K×24 ROM plus a 4K×14 lookup table (LUT) ROM. The ROM code size reduction may yield a die size reduction of uncompressed ROM of 0.427 mm to 0.002 mm in gates+ compressed ROM of 0.135 mm+0.18 mm of LUT ROM= 0.317 mm for a net reduction of 0.11 mm on the corresponding silicon die.

The operation 100 generally comprises a state (or block) 102, a state (or block) 104, a state (or block) 106, and a state (or block) 108. The state 102 may be configured as a complied ROM code image comprising a number of uncompressed ROM code words (e.g., UNCOMP_WORDa-UNCOMP_WORDy). Each of the uncompressed code words UNCOMP_WORDa-UNCOMP_WORDy generally has a respective address (e.g., ROM_ADDRa-ROM_ADDRy). The uncompressed ROM code word UNCOMP_WORD is generally implemented having a q bit width. The uncompressed memory ROM array where the code words UNCOMP_WORDa-UNCOMP_WORDy are stored is generally a y×q array, where y and q are integers. The uncompressed ROM code word UNCOMP_WORD may be presented to the state 104.

The state 104 may be configured to generate (i) a number of delta words (e.g., DELTA_WORD_a-DELTA_WORD_n), where n is an integer, and (ii) a range signal (e.g., RANGE) in response to the compiled ROM image UNCOMP_WORD. The delta word DELTA_WORD may be implemented as a representation of bit strings in the uncompressed words UNCOMP_WORD. The signal RANGE may be implemented as a number of bits that may relate to a respective bit size of the delta word DELTA_WORD. The delta words DELTA_WORD may comprise bit strings configured to minimize a size of a memory circuit where compressed code may be stored when the bit strings corresponding to the delta words DELTA_WORD are deleted from the uncompressed code words UNCOMP_WORD. The state 104 may present the delta words DELTA_WORD and the signal RANGE to the state 106.

The state 106 may be configured to generate offset and stuffing (e.g., compressed ROM code entries COMP_CODEa-COMP_CODEy and compressed ROM words COMP_ROMa-COMP_ROMw) in response to the uncompressed words UNCOMP_WORD and the delta words DELTA_WORD. The compressed ROM words COMP_ROM may be implemented as a combination of one or more compressed code entries (e.g., the compressed code entries COMP_CODEa-COMP_CODEy).

The state 106 may be configured to generate a signal (e.g., FLAG) when a particular uncompressed word UNCOMP_WORD does not contain a bit string that corresponds to one of the delta words DELTA_WORD (e.g., the word COMP_WORD is an uncompressed word UNCOMP_WORD). The state 106 may be configured to generate an offset that corresponds to the delta word DELTA_WORD location in the uncompressed code word UNCOMP_WORD. The offset may be implemented as (i) a shift signal (e.g., S) that may indicate the number of bits from a start or an end of the uncompressed code word UNCOMP_WORD (e.g., a distance) where the delta word bit string is located and (ii) a direction signal (e.g., DIR) that may indicate the direction (e.g., start or end of the uncompressed code word UNCOMP_WORD) where the shift S originates. The signals S and DIR may be implemented as multi-bit signals. The signal S is generally implemented having a bit-width that is determined in response to the bit widths of the uncompressed word UNCOMP_WORD, the delta word DELTA_WORD, the signal RANGE, and the compressed code entry COMP_CODE. The signals S and DIR may be implemented within the format of the compressed code entry COMP_CODE. An uncompression process generally inserts the bit string that corresponds to the delta word DELTA_WORD into the compressed code COMP_CODE at the location determined in response to the signals S and DIR.

Each of the compressed ROM words COMP_ROM may be implemented as (i) one or more compressed code entries (e.g., COMP_CODEx-COMP_CODEt) when bit strings that correspond to one or more of the delta words DELTA_WORD are present in the particular uncompressed ROM code word UNCOMP_WORD or (ii) an uncompressed word (e.g., UNCOMP_WORD) when no bit strings that correspond to one or more of the delta words DELTA_WORD are present in the particular uncompressed ROM code word UNCOMP_WORD.

The state 106 may be configured to generate a relative address (e.g., REL_ADDRa-REL_ADDRw) that corresponds to a respective compressed code word COMP_ROMa-COMP_ROMw, when w is an integer. Each relative address REL_ADDR may correspond to one or more of the uncompressed word addresses ROM_ADDR. A signal (e.g., NUM) may correspond to the compressed word entry location of a particular compressed code entry COMP_CODE in the compressed word COMP_ROM (e.g., a first, second, etc. entry location) when the compressed word COMP_ROM comprises multiple entries of the compressed code entry COMP_CODE. Each of the relative addresses REL_ADDRa-REL_ADDRw and the fields that contain the respective signals FLAG and NUM may be stored at a location that corresponds to a uncompressed word address ROM_ADDR in a LUT ROM (not shown, described in connection with FIGS. 5–8).

The compressed ROM code words COMP_ROM may be presented to the state 108. The state 108 may be configured to generate a compressed ROM image in response to the compressed and stuffed ROM code words COMP_ROM. In one example, the compressed ROM image generated via the state 108 may be implemented as a w×q ROM array. However, the compressed ROM image generated via the state 108 may be implemented as any appropriate word bit-width and number accordingly to meet the design criteria of a particular application. The ROM image generated via the state 108 is generally significantly smaller than the ROM array that stores the uncompressed ROM code words UNCOMP_WORD. The LUT and the compressed ROM image generated via the state 108 and/or any gates that are implemented to provide an uncompression process may be implemented in subsequent simulation processes and/or silicon (not shown).

The operation 100 may be configured as a scalable lossless compression process. The operation 100 may be implemented as a ROM code compression method and/or architecture that adapts to (i) the compressed word size, (ii) the compressed word storage ROM size, and/or (iii) the compression target level. The operation 100 may comprise an optimizing code compression process and/or architecture. The compression process 100 may be scaled via the bit-width and/or number of delta words DELTA_WORD that are implemented. The compression process 100 may be scaled via the particular delta words DELTA_WORD that are implemented. The operation 100 may be scaled (adapted) to compress a particular uncompressed ROM array size to another (smaller) target ROM array size (e.g., to a compression target level). The total die area of (i) the LUT, (ii) the compressed ROM image and (iii) any gates that are implemented to provide an uncompression process is generally significantly smaller than the die area of the uncompressed ROM image.

Figure 2:
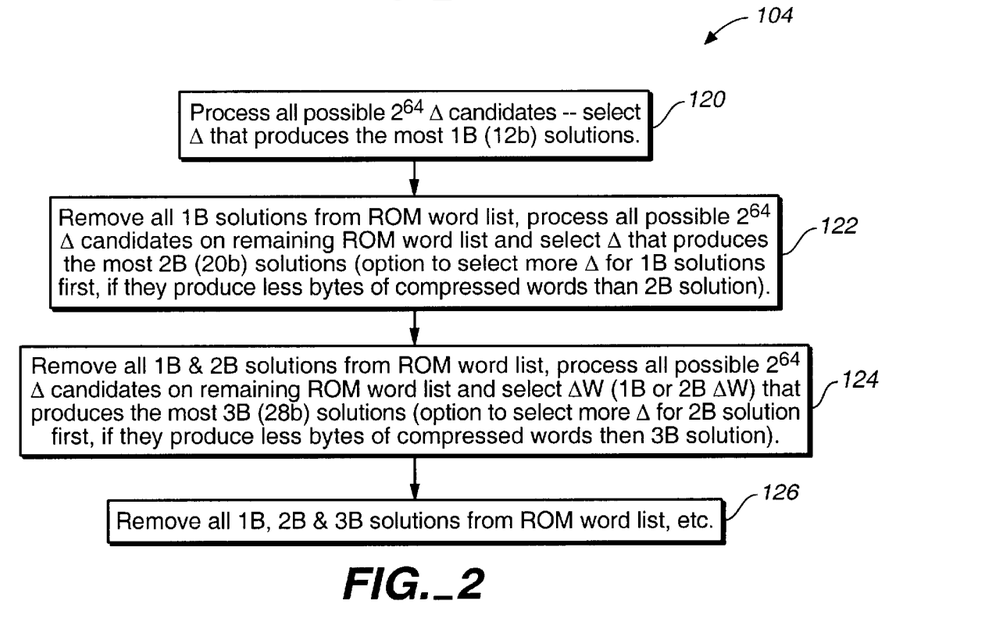
FIG. 2 is a flow chart of an optimized compression operation in connection with the present invention.

Referring to FIG. 2, a detailed flow diagram illustrating the state 104 is shown. The state 104 may be configured as an optimized compression delta word generation operation (or method, process, routine, etc.). In one example, the state 104 may implement weighting to generate the maximum number of single byte (e.g., 1B) and two-byte (e.g., 2B) delta words DELTA_WORD possible to yield compressed code entries COMP_CODE for a given array of uncompressed ROM words UNCOMP_WORD. In another example, the state 104 may implement weighting to generate the maximum number of 1B, 2B, three-byte (e.g., 3B), and four-byte (e.g., 4B) delta words DELTA_WORD possible to yield compressed code entries COMP_CODE for a given array of uncompressed ROM words UNCOMP_WORD. However, the state 104 may be configured to generate any appropriate optimized compressed ROM code entry COMP_CODE accordingly to meet the design criteria of a particular application. The state 104 generally comprises a state 120, a state 122, a state 124, and a state 126.

In one example, the uncompressed ROM code words UNCOMP_WORD may be implemented having a 64-bit width. However, any appropriate word bit width (e.g., q) may be implemented accordingly to meet the design criteria of a particular application. When the uncompressed ROM code words are implemented as 64-bit width words, the state 120 may process all potential $2^{64}$ delta word DELTA_WORD candidates. When the uncompressed ROM code words are implemented as q-bit width words, the state 120 is generally configured to process all potential $2^q$ delta word DELTA_WORD candidates. The state 120 may be configured to determine the delta word (e.g., DELTA_WORD_1) that generates the maximum number of 1B (e.g., one byte or 12 bit) solutions (e.g., locations) for the given uncompressed ROM code words UNCOMP_WORD. The maximum number of 1B solutions generally corresponds to a minimal (e.g., optimal) compressed ROM code entry COMP_CODE. The delta word DELTA_WORD_1 may be implemented as the first permanent delta word. The state 120 may present the delta word DELTA_WORD_1 to the state 122.

The state 122 may delete (e.g., filter out, remove) all of the uncompressed ROM code that corresponds to the delta word DELTA_WORD_1 from the uncompressed ROM code image (e.g., the uncompressed ROM words UNCOMP_WORDa-UNCOMP_WORDy). In one example, the state 122 may be configured to determine the delta word (e.g., DELTA_WORD_2) that generates the maximum number of 2B (e.g., two byte or 20 bit) solutions (e.g., locations) for the remaining uncompressed ROM code words. In another example, the state 122 may be configured to first determine if a second 1B (e.g., 12 bit) delta word (e.g., DELTA_WORD_1') generates a maximum number of solutions that is greater than the number of 2B solutions. The process 100 generally implements the delta word DELTA_WORD_2 or the delta word DELTA_WORD_1' that generates the greater number solutions (e.g., the minimal size of the total compressed code entries COMP_CODE). The delta word DELTA_WORD_2 (or the delta word DELTA_WORD_1') is generally implemented as the second permanent delta word. The state 122 may present the delta word DELTA_WORD_2 (or the delta word DELTA_WORD_1') to the state 124.

The state 122 may monitor the number and/or size of the compressed code entries COMP_CODE that are generated. When the uncompressed words UNCOMP_WORD have been compressed such that the target ROM size may be sufficient to store the compressed code entries COMP_CODE, the process 100 may be optimized for the target ROM.

The process 100 may be configured to monitor a compression ratio (e.g., a ratio of the overall size of the compressed code COMP_ROM to the uncompressed code UNCOMP_WORD). Since the total size of the uncompressed code words UNCOMP_WORD to be stored in ROM is generally known, the compression ratio is generally determined in direct response to the reduction in ROM size (e.g., compression) that is implemented via the process 100. When the compression ratio reaches a predetermined (e.g., user defined) level, the compression may be optimized for the design criteria of a particular application.

The state 124 may be implemented similarly to the state 122. The state 124 may delete (e.g., filter out, remove) all of the uncompressed ROM code that corresponds to the delta word DELTA_WORD_2 (or the delta word DELTA_WORD_1') from the uncompressed ROM code image words UNCOMP_WORD. In one example, the state 124 may be configured to determine the delta word (e.g., DELTA_WORD_3) that generates the maximum number of 3B (e.g., three byte or 28 bit) solutions (e.g., locations) for the remaining uncompressed ROM code words UNCOMP_WORD. In another example, the state 124 may be configured to determine if a second 2B (e.g., 20 bit) delta word (e.g., DELTA_WORD_2') generates a maximum number of solutions that is greater than the number of 3B solutions. The process 100 generally implements the delta word DELTA_WORD_3 or the delta word DELTA_WORD_2' that generates the greater number solutions (e.g., the minimal size of the total compressed code entries COMP_CODE). The delta word DELTA_WORD_3 (or the delta word DELTA_WORD_2') is generally implemented as the third permanent delta word. The state 124 may present the delta word DELTA_WORD_3 (or the delta word DELTA_WORD_2') to the state 126.

The state 126 may be configured to generate a fourth permanent delta word (e.g., DELTA_WORD_4 (or the delta word DELTA_WORD_3')) similarly to the state 122. The delta word DELTA_WORD_4 may correspond to a 36 bit delta word. When the operation 100 has determined the delta word DELTA_WORD_4 (or the delta word DELTA_WORD_3'), the compression delta word generation (e.g., the generation of the delta words DELTA_WORD_1-DELTA_WORD_4) is generally optimized.

A minimal sized compressed ROM code image (e.g., the compressed code words COMP_ROM) may be generated via the operation 100. However, additional states (not shown) and additional delta words (e.g., a DELTA_WORD_5 that may correspond to a 44 bit width) may be implemented similarly to the state 122 accordingly to meet the design criteria of a particular application. While the 1B, 2B, 3B, 4B, and 5B byte sizes generally correspond to bit-widths of 12*b*, 20*b*, 28*b*, 36*b* and 44*b*, respectively, and correspond to a 64-bit word UNCOMP_WORD implementation of the operation 100, other appropriate uncompressed ROM code word and/or corresponding delta word DELTA_WORD bit-widths may be implemented accordingly to meet the design criteria of a particular application.

In another mode of operation, the ROM code compression process 100 may be scalable. Depending on the size (e.g., bit-width and/or depth) of the target ROM (e.g., the ROM that may be configured to store the compressed code entries COMP_CODE via the compressed code words COMP_ROM), the number and/or size of delta words DELTA_WORD may be adjusted accordingly. In yet another mode of operation, since the total size of the compressed code words COMP_ROM may be adjusted via the number and/or size of delta words DELTA_WORD that are implemented, multiple entries of code that is sufficiently compressed may be stored in single word locations COMP_ROM (described in more detail in connection with FIG. 4).

Figure 3:
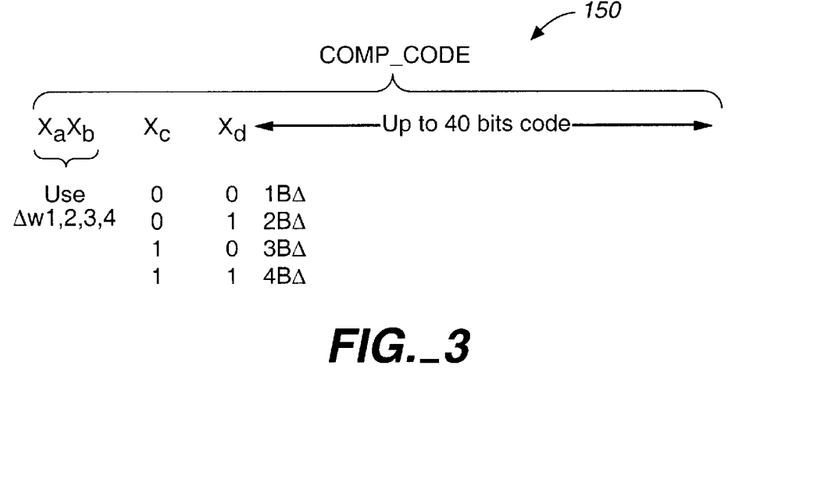
FIG. 3 is a diagram of a compressed code entry format in connection with the present invention.

Referring to FIG. 3, a diagram 150 illustrating a format corresponding to the compressed code entry COMP_CODE generated via the operation 100 is shown. In one example, the format 150 may correspond to the 64-bit uncompressed code word UNCOMP_WORD and four delta words (e.g., the delta words DELTA_WORD_1, DELTA_WORD_2, DELTA_WORD_3, and DELTA_WORD_4). However, other uncompressed code word bit-widths and other numbers and/or bit-widths of delta words may be implemented accordingly to meet the design criteria of a particular application.

In one example, the compressed code entry COMP_CODE may be implemented as an up to 44-bit width word. The compressed code entry COMP_CODE may be configured as (i) a first two bits (e.g., Xa and Xb) that may correspond to the delta words DELTA_WORD_1, DELTA_WORD_2, DELTA_WORD_3, and DELTA_WORD_4, (ii) a third and fourth two bits (e.g., Xc and Xd) that may be implemented as the signal RANGE and indicate the delta word byte-size (e.g., 1B, 2B, etc.), and (iii) up to 40 bits of other code (e.g., the signals S and DIR, and uncompressed code). The number of bits in the code entry COMP_CODE in addition to the bits Xa–Xd generally depends on the compression generated via the process 100. However, the bit-size of the compressed code entry COMP_CODE, the number of bits implemented to indicate the delta word and the size of the delta word (e.g., the bits X), and the bit-size of the signals S and DIR may be implemented as any appropriate size (e.g., none or one or more bits) accordingly to meet the design criteria of a particular application.

Figure 4:
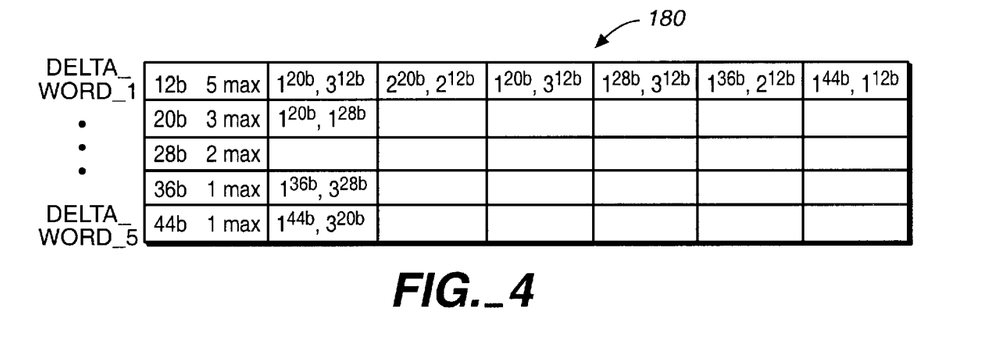
FIG. 4 is a diagram of a compressed word in connection with the present invention.

Referring to FIG. 4, a diagram 180 illustrating a number of storage alternatives of the compressed ROM code entry COMP_CODE is shown. In one example, compressed ROM code entry COMP_CODE may be stored via a 64-bit width compressed memory word (e.g., the memory word COMP_ROM). When the compressed memory word entry is implemented as the 64-bit width word COMP_ROM and the delta words DELTA_WORD_1, DELTA_WORD_2, DELTA_WORD_3, DELTA_WORD_4, DELTA_WORD_5 are implemented as 12*b*, 20*b*, 28*b*, 36*b* and 44*b* words, respectively, a number of multiple entries of the compressed code COMP_CODE may be stored at a particular location of the word COMP_ROM.

In one example, when the code entry COMP_CODE is generated having a 12*b* width, a maximum of five entries of the compressed code entry COMP_CODE may be stored in a single location of the word COMP_ROM. Similarly, one entry of the compressed code COMP_CODE that has a 20*b* width and three entries of the compressed code COMP_CODE that have a 12*b* width may be stored in a single location of the word COMP_ROM, etc. However, the compressed code entry COMP_CODE, the delta words DELTA_WORD, and/or the memory word COMP_ROM may be implemented as other bit-widths accordingly to meet the design criteria of a particular application.

Figure 5:
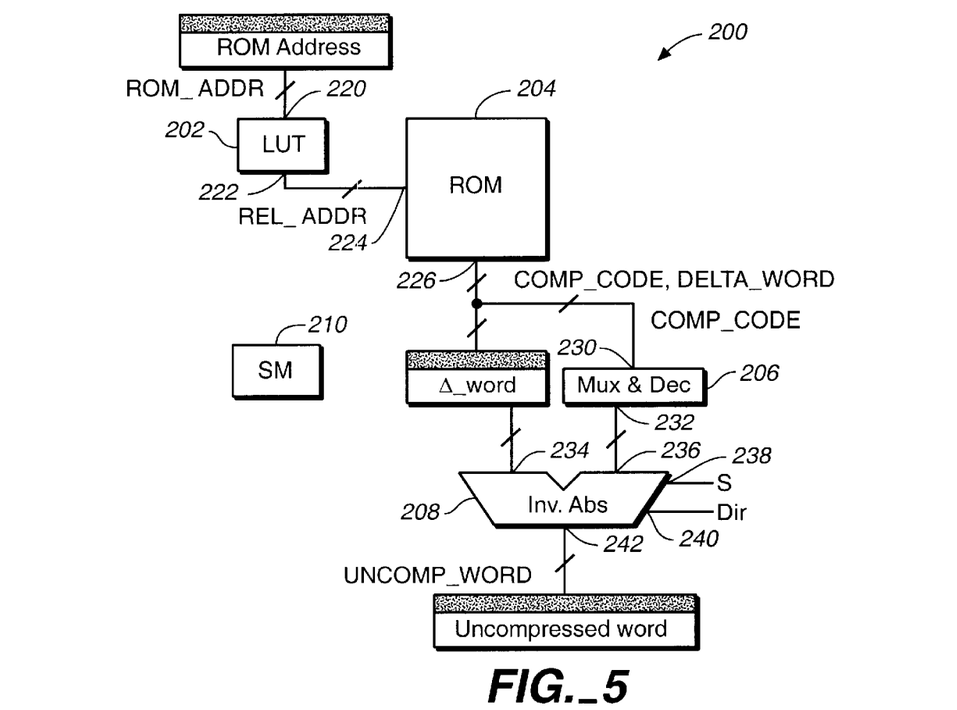
FIG. 5 is a block diagram of a preferred embodiment of the present invention.

Referring to FIG. 5, a block diagram of a circuit 200 in accordance with a preferred embodiment of an lossless uncompress (or decompress) operation (or method, process, routine, etc.) of the present invention is shown. The circuit 200 may be implemented as gate level ROM circuits and associated logic circuits that may be configured to provide (i) random word access and (ii) an uncompress process. The circuit 200 may be implemented as a lossless uncompress circuit. The circuit 200 may be configured to (i) randomly access and (ii) uncompress the compressed code entries COMP_CODE (via the compressed words COMP_ROM) generated via the process 100 to provide lossless generation of the uncompressed words UNCOMP_WORD. The circuit 200 may be configured to perform the uncompress process during a ROM access. The circuit 200 may generate substantially no additional delay time to the ROM access process when compared to the access time to conventional uncompressed ROM. The circuit 200 may be configured to losslessly generate the uncompressed ROM code UNCOMP_WORD in response to the signal ROM_ADDR. The circuit 200 may be configured as an optimal (e.g., minimal) hardware architecture to implement a random access and lossless uncompress inverse absolute function.

The circuit 200 generally comprises a circuit 202, a circuit 204, a circuit 206, one or more circuits 208, and a circuit 210. The circuit 202 may be implemented as a lookup table (LUT) ROM (or flash memory) The circuit 204 may be implemented as a ROM (or flash memory). The circuit 206 may be implemented as a multiplexer and decoder circuit. The circuit 208 may be implemented an inverse absolute function circuit (described in connection with FIG. 10). The circuit 210 may be implemented as a state machine.

The circuit 202 may have an input 220 that may receive the signal ROM_ADDR and an output 222 that may present the signal REL_ADDR. The address signal ROM_ADDR may be a ROM address presented by a user. The circuit 202 may be configured to store the address signals REL_ADDR that correspond to (e.g., that are relative to) the compressed code words COMP_ROM. The circuit 202 may be configured to present the address REL_ADDR in response to the signal ROM_ADDR.

The circuit 204 may have an input 224 that may receive the address REL_ADDR and an output 226 that may present the compressed code COMP_CODE and the respective delta words DELTA_WORD. The circuit 204 may be configured to (i) store the compressed words COMP_ROMa-COMP_ROMw and the delta words DELTA_WORD_a-DELTA_WORD_n and (ii) present the compressed code entries COMP_CODEa-COMP_CODEy and the delta words DELTA_WORD_a-DELTA_WORD_n. The circuit 204 may be configured to present the compressed code entry COMP_CODE and the respective delta words DELTA_WORD in response to the signal ROM_ADDR via the signal REL_ADDR (and the respective signal NUM).

The circuit 206 may have an input 230 that may receive the compressed ROM code entry COMP_CODE and an output 232 that may present the compressed code entry COMP_CODE that corresponds to the address ROM_ADDR. The circuit 206 may be configured to select the compressed code entry COMP_CODE in response to the respective delta word DELTA_WORD. The circuit 206 may be serially coupled to the circuit 208.

The circuit 208 may have an input 234 that may receive the signal DELTA_WORD, an input 236 that may receive the compressed code entry COMP_CODE, an input 238 that may receive the signal S, an input 240 that may receive the signal DIR, and an output 242 that may present the lossless uncompressed ROM code word UNCOMP_WORD. The circuit 208 may be configured to provide lossless generation of the signal UNCOMP_WORD in response to the delta word DELTA_WORD, the compressed code entry COMP_CODE, and the signals S and DIR. When the signal FLAG indicates that the code entry COMP_CODE contains an uncompressed word, the circuit 200 may be configured to bypass the circuits 206 and/or 208 and directly present the uncompressed word UNCOMP_WORD (not shown).

The state machine 210 may be configured to control the operation of the circuit 200. However, the circuit 200 may be controlled via any appropriate method and/or architecture to meet the design criteria of a particular application. The hardware uncompress process implemented via the circuit 200 may be implemented during the access cycle of the ROM circuits 202 and 204 and have minimal effect on access time when compared to conventional uncompressed ROM access time.

Figure 6:
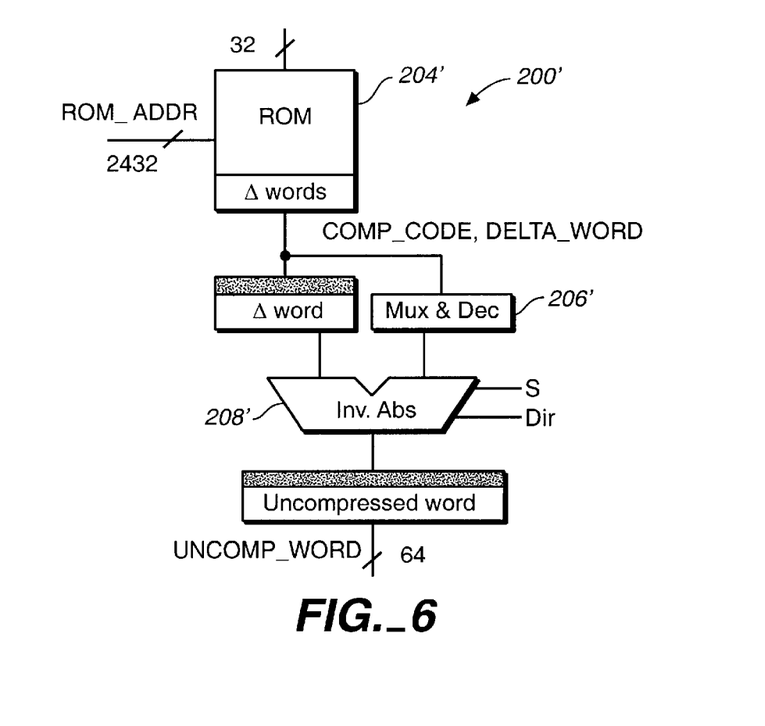
FIG. 6 is a block diagram of an exemplary implementation of the present invention.

Referring to FIG. 6, a block diagram 200' illustrating an example implementation of the present invention is shown. The circuit 200' may be implemented similarly to the circuit 200. The circuit 200' may be implemented without the LUT circuit 202. The circuit 204' may be configured to present the signals COMP_CODE and DELTA_WORD in response to the address signal ROM_ADDR. The circuit 200' may be configured to implement a 64-bit width uncompressed word UNCOMP_WORD. The compressed code words COMP_ROM and the delta words DELTA_WORD may be stored in a 2.432K×32 ROM 204'.

Figure 7:
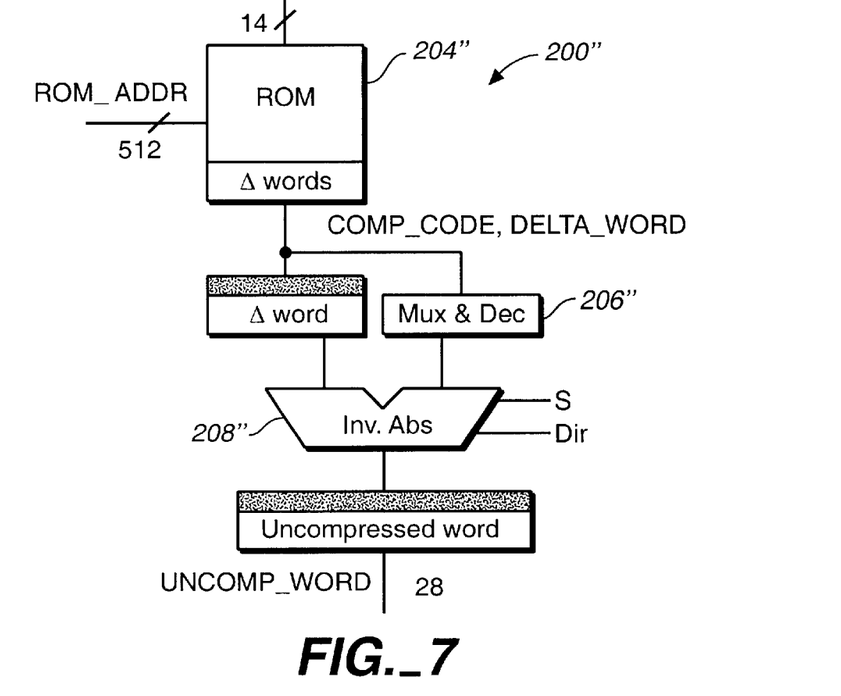
FIG. 7 is a block diagram of an another exemplary implementation of the present invention.

Referring to FIG. 7, a block diagram 200" illustrating an example implementation of the present invention is shown. The circuit 200" may be implemented similarly to the circuits 200 and 200'. The circuit 200" may be configured to implement a 28-bit width uncompressed word UNCOMP_WORD. The compressed code words COMP_ROM and the delta words DELTA_WORD may be stored in a 512×14 ROM 204".

Figure 8:
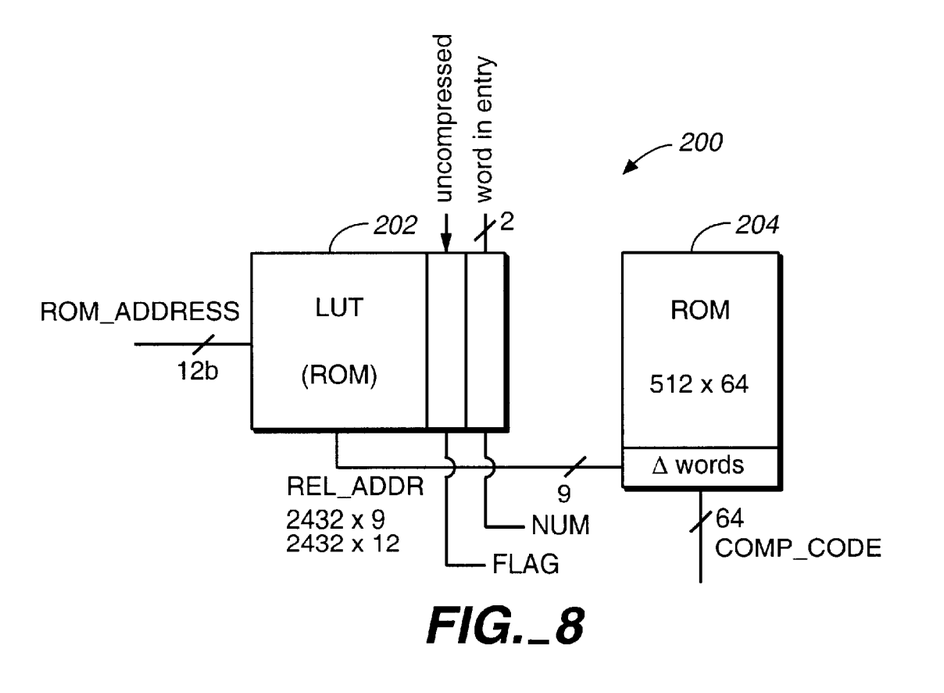
FIG. 8 is a block diagram of a compressed ROM in connection with the present invention.

Referring to FIG. 8, a diagram illustrating an example implementation of the uncompress circuit 200 of the present invention is shown. In one example, the circuit 200 may comprise the LUT circuit 202 and the ROM circuit 204. The circuit 202 may be configured as a 2.432K×12 ROM. The address signal ROM_ADDR may be implemented as a 12-bit word. The address signal REL_ADDR may be implemented as a 12-bit word having a 9-bit width address field (e.g., an address field that may be configured to correspond to 512 compressed code words COMP_ROM), a 1-bit field that may be configured to store the signal FLAG, and a 2-bit field that may be configured to store the signal NUM.

The circuit 204 may be implemented as a 512×64 ROM. The compressed code word COMP_ROM may be implemented as a 64-bit width word. The delta words DELTA_WORD are generally stored at an end of the circuit 204. The circuit 204 may be configured to store 2.432K×64 uncompressed code words UNCOMP_WORD as 512×64 compressed words COMP_ROM. The combination of the 2.432K×12 circuit 202 and the 512×64 circuit 204 (and logic gates to implement uncompression, not shown) may yield a significant die area reduction when compared to an implementation of a conventional 2.432K×64 code ROM. However, the present invention may be implemented having any appropriate size (depth and/or width) circuits 202 and 204 accordingly to meet the design criteria of a particular application. The implementation of the circuits 202 and 204 of the present invention generally yields significant die area reduction when compared to convention uncompressed ROM code storage.

Figure 9:
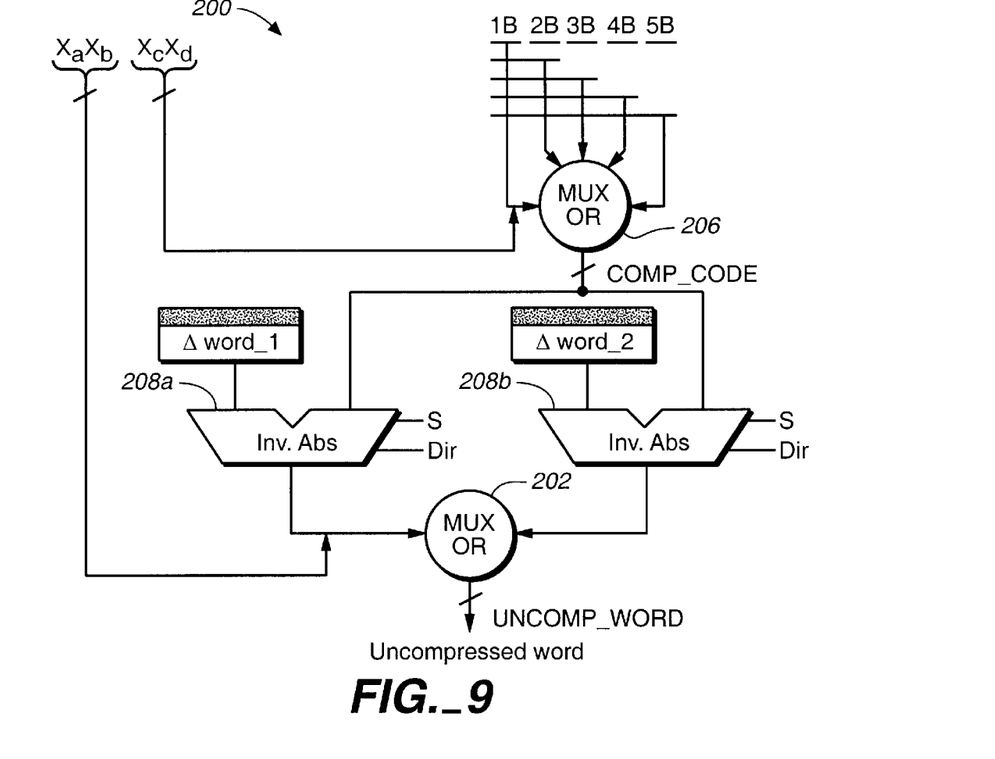
FIG. 9 is a block diagram of a hardware uncompress in connection with the present invention.

Referring to FIG. 9, a block diagram illustrating an example of the uncompress circuit 200 of the present invention is shown. In one example, the circuit 200 may comprise the circuit 206, a circuit 208a, a circuit 208b, and a circuit 212. The circuit 212 may be implemented as a multiplexer circuit.

The circuit 206 may be configured to select the appropriate delta word DELTA_WORD byte-width (e.g., 1B, 2B, etc.) in response to the Xc–Xd fields of the compressed code entry signal COMP_CODE. The circuit 208a may be configured to insert the uncompressed code that corresponds to the delta word DELTA_WORD_1 at the appropriate location in the compressed code entry COMP_CODE in response to the signals S and DIR. The circuit 208b may be configured to insert the uncompressed code that corresponds to the delta word DELTA_WORD_2 at the appropriate location in the compressed code entry COMP_CODE in response to the signals S and DIR. The circuit 212 may be configured to select the appropriate uncompressed word presented by the circuit 208a or the circuit 208b in response to the Xa–Xb fields of the compressed code entry COMP_CODE.

Figure 10:
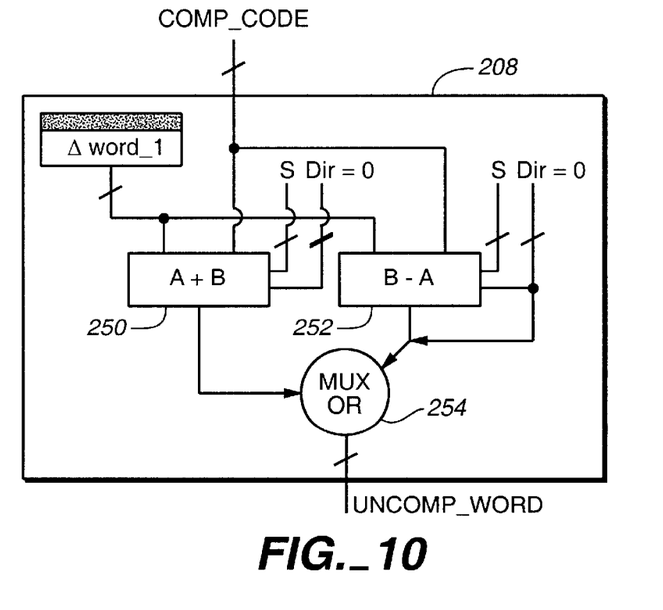
FIG. 10 is a block diagram of an inverse absolute function in connection with the present invention.

Referring to FIG. 10, a block diagram illustrating the circuit 208 is shown. The circuit 208 generally comprises a circuit 250, a circuit 252, and a circuit 254. The circuit 250 may be implemented as a summing (e.g., adder) circuit. The circuit 252 may be implemented as a subtracting (e.g., difference) circuit. The circuit 254 may be implemented as a multiplexer circuit.

The circuit 208 may be configured to insert the appropriate delta word (e.g., B) at the appropriate location in the compressed code entry COMP_CODE field (e.g., A) to generate the respective uncompressed code word UNCOMP_WORD in response to the signals S and DIR. In one example, the delta word B may correspond to the delta word DELTA_WORD_1. However, the delta word B may be implemented as any appropriate delta word (e.g., DELTA_WORD_1', DELTA_WORD_2, etc.) to meet the design criteria of a particular application.

In one example, when the signal DIR is a logical 0 (e.g., LOW or off), the circuit 250 may be configured to insert the delta word B at a positively shifted location (e.g., add) determined by the signal S. When the signal DIR is a logical 1 (e.g., HIGH or on), the circuit 252 may be configured to insert the delta word B at a negatively shifted location (e.g., subtract) determined by the signal S. The circuit 254 may be configured to select the signal generated via the circuit 250 or the circuit 252 as the appropriate uncompressed word UNCOMP_WORD in response to the signal DIR.

Figure 11:
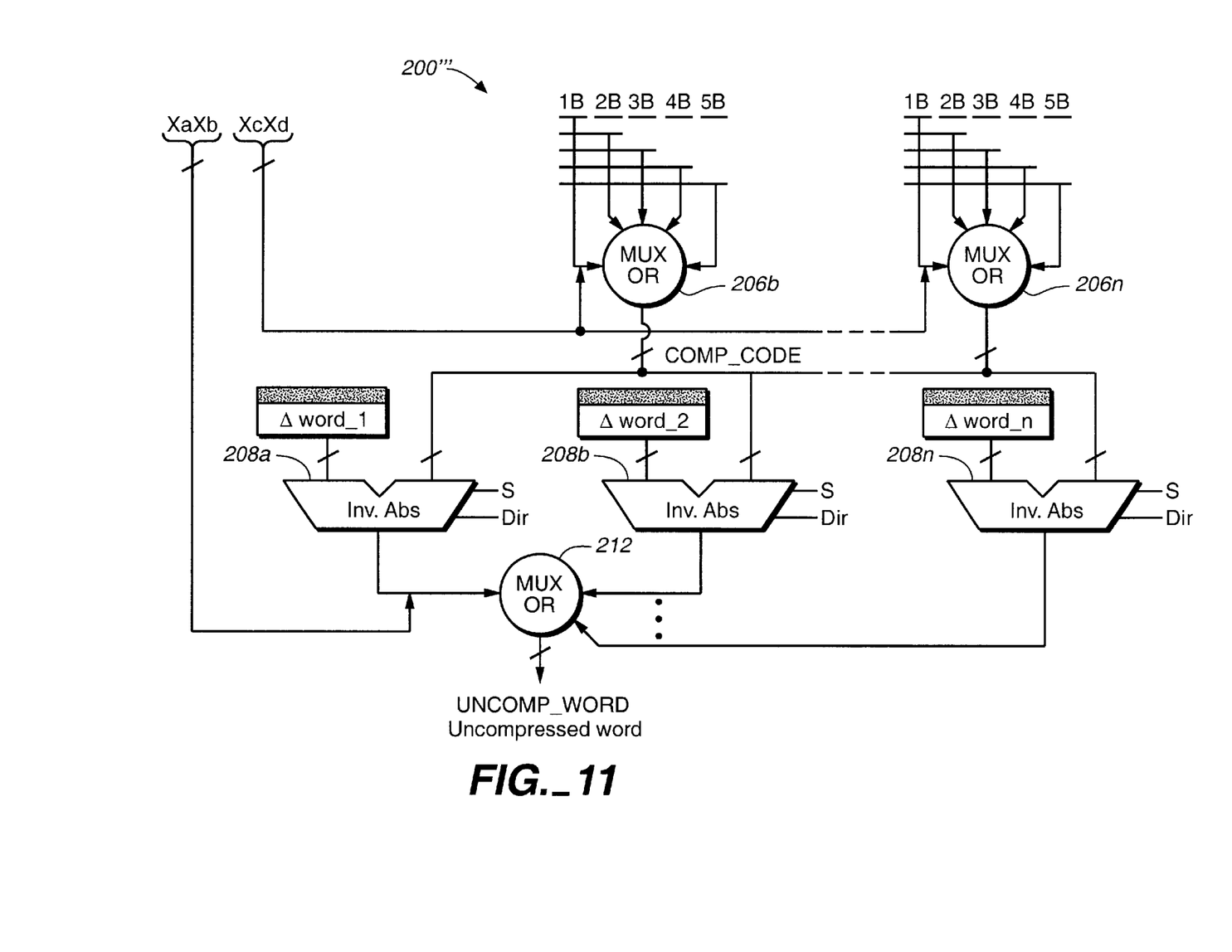
FIG. 11 is a block diagram of another hardware uncompress in connection with the present invention.

Referring to FIG. 11, a block diagram of a circuit 200''' is shown. The circuit 200''' may be implemented similarly to the circuit 200. The circuit 200''' generally comprises multiple parallel coupled circuits 206 (e.g., 206b–206n) and 208 (e.g., 208a–208n). The circuit 200''' may be implemented when a number of delta words (e.g., DELTA_WORD_a-DELTA_WORD_n) are implemented. The circuit 200 may be configured to provide a high compression. The circuit 200 may be configured to provide a compression that may be optimized to any appropriate level to meet the design criteria of a particular design. However, the circuit 200 may be implemented having any appropriate number of delta words DELTA_WORD and/or circuits 206 and 208 to meet the design criteria (e.g., uncompressed code word width and/or depth, compressed code word width and/or depth, code parameters such as degree of randomness, level of compression to be implemented, hardware architecture performance, etc.) of a particular application.

The present invention may provide a ROM compression operation that is configured to (ii) process the compiled ROM image (e.g., the uncompressed ROM UNCOMP_WORD), (ii) generate offset (e.g., compressed code entry COMP_CODE), (iii) stuff the compressed code entry COMP_CODE in an optimal way in the available ROM memory width (e.g., as the compressed words COMP_ROM), and/or (iv) generate the look-up table (e.g., the LUT 202) for addressing (via the relative address REL_ADDR) the compressed word memory location that is relative to the uncompressed word address ROM_ADDR. In another example, the present invention may be implemented without the look-up table. The present invention may be configured to implement minimal and fast hardware to uncompress the compressed words COMP_ROM via (i) known delta words DELTA_WORD (base) available in memory 204 and (ii) multiple parallel absolute functions implemented via the circuit 208. A single cycle access to the ROM that is implemented to store the compressed code (e.g., the LUT 202 and/or the ROM 204) is generally maintained.

The compression process (or method, operation, routine, etc.) 100 of the present invention may be implemented in software, firmware, hardware, and/or any appropriate combination thereof. The compression process 100 may be configured to provide compression based on user predefined constraints such as memory size, compressed word format options, compressed word memory entry stuffing options, and/or hardware performance architecture options.

In one example, the compression process 100 may be configured to optimize for the maximum number of smallest compression word entries (e.g., via generating the first optimal delta word DELTA_WORD_1), then the second to maximum number of smallest compression word entries (e.g., via generating the second optimal delta word DELTA_WORD_2). Other entries may be configured to implement one of the two delta words established. However, the present invention may be configured to generate any appropriate number and/or size delta words to meet the design criteria of a particular application.

The present invention may be implemented as a ROM code compression method and/or architecture that includes a lookup table (LUT) ROM that may be configured to provide location mapping to any ROM word (e.g., random access). The present invention may be implemented as ROM output uncompress (decompress) via a programmed delta word base with multiplexer control and decode. The compression/uncompression process of the present invention may be scalable to different compressed and/or uncompressed word size and/or depth as well as the size and/or number of delta words that are implemented.

The present invention may have broad applicability. The present invention may be implemented as on-chip ROM, off-chip ROM, a combination of on-chip and off-chip ROM, and/or multiple stages of ROM. The present invention may be implemented in ASICs, CSICs FPGAs, standard parts, and/or embedded in ROM and/or flash devices. In one example, a small boot loader (not shown) may be implemented to provide a download of the compressed ROM (e.g., COMP_ROM and/or COMP_CODE). In another example (not shown), the boot loader may be compressed as well.

The present invention may be implemented having a compressed code entry format that may be configured to provide multiple compressed code entries to be stuffed in a given compressed word location. A relative addressing scheme may be implemented to provide random access to the compressed code entries.

The present invention is generally implemented having any appropriate number of delta words configured to optimize (e.g., minimize) the compressed ROM size. However, in one example, the present invention may be implemented such that the most single-byte and two-byte compressions are provided.

The present invention may be configured to provide compressed code to reduce ROM size. The present invention may be especially beneficial when the ROM size configured to store the uncompressed code is greater than 100K bits. Many ASICs that are currently implemented are configured having one or more embedded ROMs that exceed 100K bits. The present invention may be implemented in an ASIC ROM (memory array) compiler such that the ROM size savings is deterministic and easily implemented by the user.

The present invention may be implemented by flash and ROM standard part device manufacturers to provide a reduction in the amount of memory to be configured for systems. In one example, the present invention may be implemented via embedding the uncompress logic and providing software to the user to compress the code to be downloaded or burned in the device. However, the present invention may be implemented via any appropriate method and/or architecture to meet the design criteria of a particular application.

The present invention may provide a significant die size reduction when compared to conventional techniques for storing code in ROM. The present invention may be implemented to provide future process technology migrations for many ASICs, CSICs, and/or standard parts. The present invention may provide significant ROM cost savings for systems with flash memory that may be configured to provide the uncompress process of the present invention and run from SDRAM.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation. Additionally, inverters may be added to change a particular polarity of the signals.

The present invention may also be implemented by the preparation of ASICs, CSICs, FPGAs, and/or by interconnecting an appropriate network of conventional component circuits (such as a conventional circuit implementing a state machine), as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMS, RAMS, EPROMs, EEPROMs, flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    one or more memory circuits configured to (a) store (i) a number of compressed code words and (ii) a number of delta words, and (b) provide random access to said compressed code words in response to an address, wherein (a) said compressed code words are losslessly compressed in response to (i) a number of uncompressed code words and (ii) said delta words and (b) said delta words comprise bit strings configured to minimize a size of said one or more memory circuits when deleted from said uncompressed code words; and
    an uncompress circuit configured to losslessly uncompress said compressed code words in response to said delta words.

2. The apparatus according to claim 1, wherein (i) said compressed code words are compressed via a scalable compression process and (ii) said compression process is scalable in response to a bit-size and a number of said delta words.

3. The apparatus according to claim 1, wherein said compressed code words are compressed via a compression process configured to adapt to a size of said one or more memory circuits.

4. The apparatus according to claim 1, wherein said compressed code words are compressed via a process configured to adapt to a compression level target.

5. The apparatus according to claim 3, wherein said compressed code words are compressed via a process configured to optimize said code word compression in response to said size of said one or more memory circuits.

6. The apparatus according to claim 1, wherein (i) said compressed code words comprise one or more compressed code entries and (ii) each of said compressed code entries corresponds to one of said uncompressed code words.

7. The apparatus according to claim 1, wherein said compressed code words comprise one of said uncompressed code words.

8. The apparatus according to claim 6, wherein said compressed code entries are accessed in response to (i) a relative address and (ii) a compressed location signal, wherein said compressed location signal is configured to indicate a location of said compressed code entry in said compressed code word when said compressed code word comprises multiple entries of said compressed code entry.

9. The apparatus according to claim 6, wherein said compressed code entries comprise (i) one or more bits configured to indicate said delta word, (ii) one or more bits configured to indicate a range of said delta word, (iii) a shift signal configured to indicate a distance in said uncompressed word wherein said bit string comprising said delta word is deleted, and (iv) a direction signal configured to indicate a direction of said shift signal.

10. The apparatus according to claim 8, wherein said one or more memory circuits are further configured to store (i) said relative address, (ii) a flag signal configured to indicate whether said compressed code word comprises one of said uncompressed code words, and (iii) said compressed location signal.

11. The apparatus according to claim 9, wherein said uncompress circuit comprises a multiplexer and decoder circuit serially coupled to an inverse absolute function circuit.

12. The apparatus according to claim 9, wherein said uncompress circuit comprises a number of parallel coupled (i) multiplexer and decoder circuits and (ii) inverse absolute function circuits serially coupled to an inverse absolute function circuit.

13. The apparatus according to claim 11, wherein said inverse absolute function circuit comprises (a) a summing circuit configured to generate said uncompressed code word in response to (i) a respective one of said delta words, (ii) said compressed code entry, and (iii) said shift and direction signals, (b) a difference circuit configured to present said uncompressed code in response to (i) said respective one of said delta words, (ii) said compressed code entry, and (iii) said shift and direction signals, and (c) a multiplexer circuit configured present said uncompressed code in response to said respective one of said delta words.

14. The apparatus according to claim 1, wherein said apparatus further comprises a state machine configured to control an operation of said one or more memory circuits and said uncompress circuit.

15. An apparatus configured to minimize a read only memory (ROM) size comprising:
    means for generating a number of delta words in response to a number of uncompressed code words, wherein said delta words comprise bit strings configured to generate said minimum ROM size when deleted from said uncompressed code words;
    means for losslessly compressing said uncompressed code words in response to said delta words and storing (i) said compressed code words and (ii) said delta words in said ROM; and
    means for randomly accessing and losslessly uncompressing said compressed code words from said ROM in response to (i) an address and (ii) said delta words.

16. A method of minimizing read only memory (ROM) size comprising the steps of:
    (A) generating a number of delta words in response to a number of uncompressed code words, wherein said delta words comprise bit strings configured to generate said minimum ROM size when deleted from said uncompressed code words;
    (B) losslessly compressing said uncompressed code words in response to said delta words and storing (i) said compressed code words and (ii) said delta words in said ROM; and
    (C) randomly accessing and losslessly uncompressing said compressed code words from said ROM in response to (i) an address and (ii) said delta words.

17. The method according to claim 16, wherein step (B) further comprises generating said compressed code words in response to one or more compressed code entries and each of said compressed code entries is configured to correspond to one of said uncompressed code words.

18. The method according to claim 16, wherein step (A) further comprises the substeps of:
    (A-1) generating a first delta word having a first bit size;
    (A-2) removing all of said uncompressed code words containing said first delta word to generate remaining uncompressed code words; and
    (A-3) generating a second delta word having a second bit size larger than said first bit size in response to said remaining uncompressed code words.

19. The method according to claim 16, wherein said method further comprises the step of:

optimizing said number of delta words in response to a predetermined size of said ROM.

20. The method according to claim 16, wherein step (C) comprises losslessly uncompressing said compressed code words during a single access of said ROM.

21. A computer readable medium containing one or more sets of computer executable instructions for performing steps for for minimizing a read only memory (ROM) size, wherein said steps comprise:

(A) generating a number of delta words in response to a number of uncompressed code words, wherein said delta words comprise bit strings configured to generate said minimum ROM size when deleted from said uncompressed code words;

(B) losslessly compressing said uncompressed code words in response to said delta words and storing (i) said compressed code words and (ii) said delta words in said ROM; and (C) randomly accessing and losslessly uncompressing said compressed code words from said ROM in response to (i) an address and (ii) said delta words.

22. An apparatus configured to execute one or more sets of computer executable instructions for performing steps for minimizing a read only memory (ROM) size, wherein said steps comprise:

(A) generating a number of delta words in response to a number of uncompressed code words, wherein said delta words comprise bit strings configured to generate said minimum ROM size when deleted from said uncompressed code words;

(B) losslessly compressing said uncompressed code words in response to said delta words and storing (i) said compressed code words and (ii) said delta words in said ROM; and (C) randomly accessing and losslessly uncompressing said compressed code words from said ROM in response to (i) an address and (ii) said delta words.

* * * * *